US007414896B2

(12) United States Patent
Oh

(10) Patent No.: US 7,414,896 B2
(45) Date of Patent: Aug. 19, 2008

(54) TECHNIQUE TO SUPPRESS BITLINE LEAKAGE CURRENT

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 352 days.

(21) Appl. No.: 11/225,465

(22) Filed: Sep. 13, 2005

(65) Prior Publication Data

US 2007/0058447 A1 Mar. 15, 2007

(51) Int. Cl.
*G11C 7/10* (2006.01)
(52) U.S. Cl. .............................. 365/189.011; 365/182; 365/202; 365/203
(58) Field of Classification Search ............ 365/189.01, 365/182, 202, 203, 205, 207, 225.7, 189.011
See application file for complete search history.

(56) References Cited

U.S. PATENT DOCUMENTS

| 6,480,434 | B1 * | 11/2002 | Lee ............................. 365/203 |
| 2004/0145959 | A1 * | 7/2004 | Kuge et al. ............ 365/230.03 |
| 2006/0092731 | A1 * | 5/2006 | Kang et al. ................. 365/203 |

* cited by examiner

*Primary Examiner*—Richard T. Elms
*Assistant Examiner*—Toan Le
(74) *Attorney, Agent, or Firm*—Patterson & Sheridan, L.L.P.

(57) ABSTRACT

Methods and apparatus that may help reduce standby current in memory devices are provided. By separating equalizing and precharging functions into separate circuit structures, current paths between a source of precharge voltage and a defective wordline (e.g., having an inadvertent short to a bitline due to a manufacturing defect) may be eliminated.

26 Claims, 16 Drawing Sheets

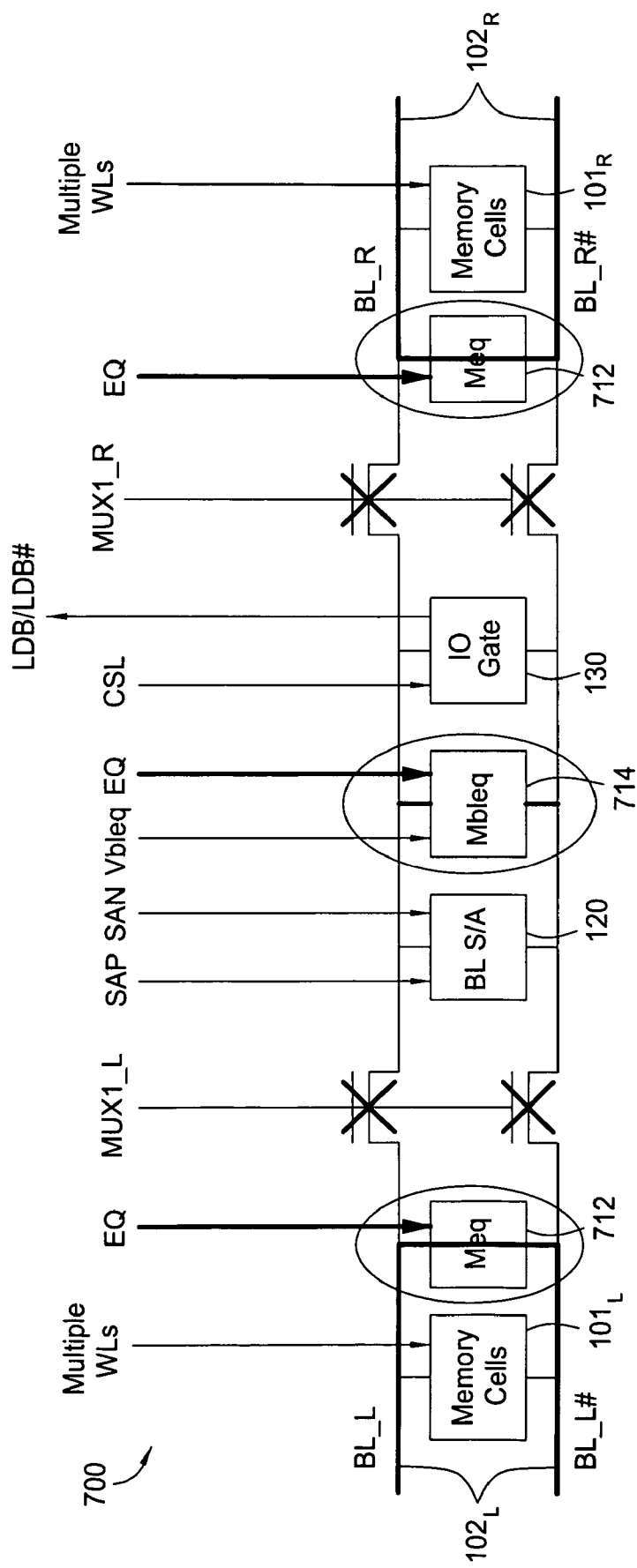

PRECHARGE

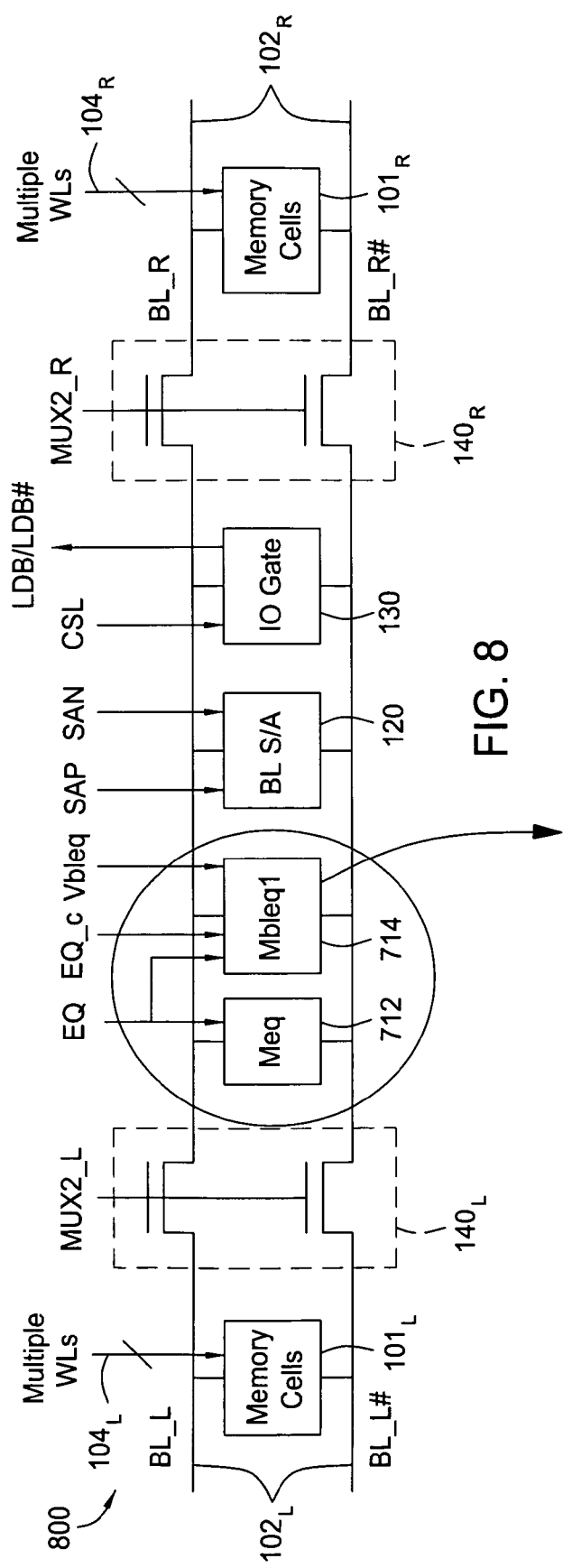
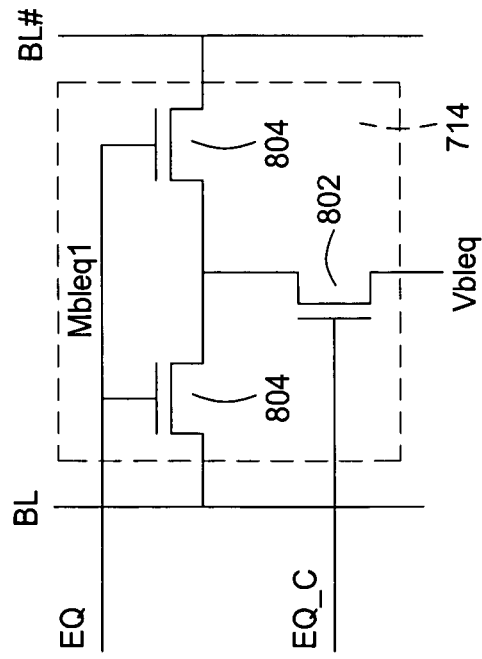
FIG. 8
FIG. 9

STANDBY

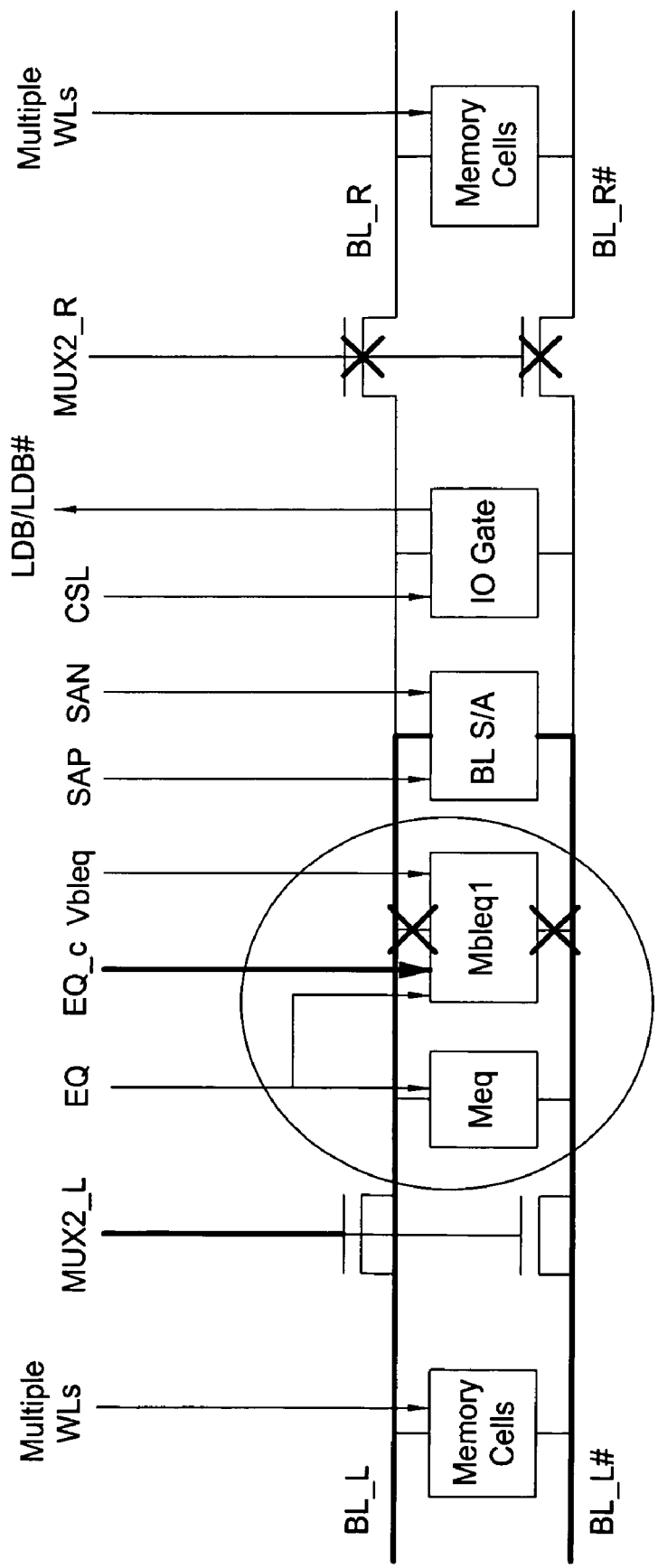
FIG. 11C SENSE

US 7,414,896 B2

TECHNIQUE TO SUPPRESS BITLINE LEAKAGE CURRENT

BACKGROUND OF THE INVENTION

1. Field of the Invention

The invention generally relates to memory devices, and more particularly to reducing current consumption of memory devices.

2. Description of the Related Art

Users of electronic devices often desire large amounts of memory in a small package. Where the electronic devices are portable (e.g., battery powered), users may also desire electronic devices which do not consume as much power and therefore have a longer battery life. Thus, manufacturers of electronic devices typically desire small, high density memory devices with low power consumption. Of particular importance is the amount of current consumed when the memory devices are in a standby mode (i.e., standby current), which typically has a specified maximum value. To meet the demand for small, high density memory devices, memory manufacturers have created dynamic random access memory (DRAM) devices with the smallest available features (e.g., transistors and control lines) and with densely packed memory cells. Examples of DRAM devices include single data rate (SDR) and double data rate (DDR) DRAM devices, pseudo static random access memory (PSRAM) devices, and the like, all collectively referred to herein as DRAM devices.

However, as the size of features in a memory chip shrinks and as the memory density of a memory chip increases, small, uncontrollable errors in the manufacturing process may cause defects at a high cost to the manufacturer. An example of a possible defect is a short (e.g., an unintended electrical connection) between a wordline and a bitline used to access a memory cell. In some bitline structures, these shorts may result in increased standby current due to voltage differences created between the wordline and bitline when the bitline is maintained at a precharge voltage level.

For example, FIG. 1 illustrates an exemplary DRAM bitline structure 100 in which equalization circuitry 110 maintains complementary bitline pairs 102 at a precharge voltage level ($V_{BLEQ}$) when wordlines 104 are not activated to access corresponding memory cells 101. In the "folded" bit line structure shown, left and right side bit line pairs ($102_L$ and $102_R$) share a common set of bit line sense amplifier (BLSA) 120. I/O gate 130 drives the output of the sense amplifier out of the array (e.g., to a secondary sense amplifier) in conjunction with a column select line (CSL) signal.

Switches (or switches) $140_L$ and $140_R$ are provided to select whether the left or right side bit line pairs are coupled to the BLSA 120, to access memory cells 101 in the left or ride side of the array, respectively. In other words, when accessing memory cells $101_R$ on the right side, switch $140_R$ may be turned on to couple complementary bit line pair $102_R$ to BLSA 120, while switch $140_L$ may be turned off to isolate complementary bit line pair $102_L$ to BLSA 120. Similarly, when accessing memory cells $101_R$ on the left side, multiplexor (or switch) $140_L$ may be turned on while switch $140_R$ may be turned off.

For some embodiments, separate equalization circuits 110 (provided outside the switches 140) may be provided for each complementary bit line pair $102_L$ and $102_R$. However, a single equalization circuitry 110 located between the switches 140, as shown, may be shared between both complementary bit line pairs and provide a more compact design.

FIG. 2 illustrates an exemplary precharge and equalization circuit 110, controlled by an equalization signal (EQ). As illustrated, the circuit 110 may include a separate equalization circuit (MEQ) 112 which illustratively includes an N-type transistor for coupling both bit lines of a complementary bit lines 102 together in response to the EQ signal, thereby causing the bit lines to reach a common voltage level (i.e., equalize). A separate precharge circuit (MBLEQ) 114 illustratively includes a pair of N-type transistors to apply a precharge voltage signal ($V_{LBEQ}$) to both bit lines in response to the EQ signal.

The timing diagram shown in FIG. 3 illustrates how the equalization circuit 110 operates to equalize and precharge complementary bit line pairs before and after a row access. As illustrated, prior to the row access (time T5), both switches are turned on (MUX_L and MUX_R=HI) and EQ is asserted, thereby allowing bit line pairs on both sides to be equalized and precharged (to $V_{BLEQ}$). The access begins at T1, for example, with a Row_Active signal being asserted, which causes the switch 140 for the side not being accessed to be turned off (illustratively, a left side access is performed) and the EQ signal to be de-asserted, thereby decoupling the bit lines. At time T2, the selected word line (e.g., one the left side) is activated and sensing of corresponding memory cells occurs in period T3.

In period T4, the selected wordline is de-activated, the switch 140 for the non-selected side is again turned on, and the EQ signal is again asserted. To ensure none of the corresponding memory cells are coupled to the bit lines, a zero voltage or negative voltage is typically applied to de-activated wordlines, resulting in a voltage difference between the wordlines and bitlines. Asserting the EQ signal and turning on both switches 140 ensures the bit lines are equalized and maintained (in period T5) at the $V_{BLEQ}$ by equalization circuit 110 until the next access.

Unfortunately, this approach results in increased current draw in the event a defect causes a short 402 between a (defective) wordline $104_D$ and a bitline 102, as shown in FIG. 4. Even thought the defective wordline would likely be replaced by redundancy, due to the difference in voltage between the defective wordline $104_D$ (maintained at 0V or less) and the bitline 102 (maintained at $V_{BLEQ}$), current ($I_{SHORT}$) may flow from the equalization circuit 110 to the defective wordline across the short. Compounding the problem, in case the defective wordline $104_D$ is maintained at a negative voltage (below 0V), a charge pump, which has inherent inefficiencies, is typically utilized. For example, assuming 50% efficiency, the charge pump has to consume twice as much current to generate $I_{SHORT}$.

As previously described, standby current consumption is particularly important for low powered memory devices. In some cases, increased current consumption due to bitline shorts may result in a memory device exceeding the specified minimum standby current, thereby resulting in decreased production yield. Accordingly, what is needed are methods and apparatuses for reducing standby current consumption of a memory device due to bitline shorts.

SUMMARY OF THE INVENTION

Embodiments of the invention generally provide methods and apparatus for accessing memory cells in a manner that may reduce standby current.

One embodiment provides a method for accessing memory cells of a memory device. The method generally includes equalizing bitlines of a complementary bitline pair between accesses of memory cells involving the complementary bitline pair to bring the bitlines of the complementary bitline pair to a common voltage level, and decoupling the bitlines of the complementary bitline pair from a precharge voltage source during the equalizing.

Another embodiment provides a method for accessing memory cells of a memory device. The method generally includes accessing a set of memory cells with a first pair of complementary bitlines that share a common sense amplifier with a second pair of complementary bitlines, equalizing a first pair of complementary bitlines, precharging the first pair of complementary bitlines by coupling the first pair of complementary bitlines to a precharge voltage source, and decoupling the first pair of complementary bitlines from the precharge voltage source prior to accessing the memory cells again with the first pair of complementary bitlines.

Another embodiment provides a method for accessing memory cells of a memory device. The method generally includes equalizing first and second pairs of complementary bitlines between accesses of memory cells, wherein each access involves one of the first and second pair of complementary bitlines and a bit line sense amplifier shared between the first and second pairs of complementary bitlines, and decoupling the first and second pairs of complementary bitlines from a precharge voltage source during the equalizing.

Another embodiment provides a memory device generally including at least one pair of complementary bitlines, a plurality of wordlines to selectively couple memory cells to the complementary bitline pair, equalize circuitry and precharge circuitry. The equalize circuitry is generally configured to equalize the pair of complementary bitlines between accesses of the memory cells. The precharge circuitry is generally configured to decouple the pair of complementary bitlines from a precharge voltage source between accesses of the memory cells.

Another embodiment provides a bitline structure generally including a bitline sense amplifier, first and second pairs of complementary bitlines that share the bitline sense amplifier, and control circuitry. The control circuitry is generally configured to access a set of memory cells with the first pair of complementary bitlines, equalize the first pair of complementary bitlines after the access, precharge the first pair of complementary bitlines by coupling the first pair of complementary bitlines to a precharge voltage source, and decouple the first pair of complementary bitlines from the precharge voltage source prior to a subsequent access of the memory cells.

Another embodiment provides a memory device generally including first and second pairs of complementary bitlines that share a common bitline sense amplifier, a plurality of wordlines to selectively couple memory cells to the first and second pairs of complementary bitlines, equalize means and precharge means. The equalize means is generally for equalizing the first and second pairs of complementary bitlines between accesses of the memory cells. The precharge means is generally for decoupling the pair of complementary bitlines from a precharge voltage source between accesses of the memory cells.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-7C illustrate the exemplary bitline structure of FIG. 5 at various stages of a memory cell access.

FIG. 8 illustrates another exemplary bitline structure in accordance with one embodiment of the present invention.

FIG. 9 illustrates an exemplary precharge circuit in accordance with one embodiment of the present invention.

DETAILED DESCRIPTION OF THE PREFERRED EMBODIMENT

Embodiments of the invention generally provide methods and apparatus that may help reduce standby current in memory devices. By separating equalizing and precharging functions into separate circuit structures, current paths between a source of precharge voltage and a defective wordline (e.g., having an inadvertent short to a bitline) may be eliminated. As a result, an increase in standby current may be avoided and a part that might otherwise fail standby current specification may pass, thereby increasing production yield.

For illustrative purposes, "folded" bitline structures which share a set of sense amplifiers between multiple (e.g., left and right side) complementary bit line pairs are described. However, those skilled in the art will recognize that these particular structures are exemplary only and that the concepts of the present invention described herein may be applied in a wide variety of bitline structures.

Exemplary Bitline Structures

Figure 5:
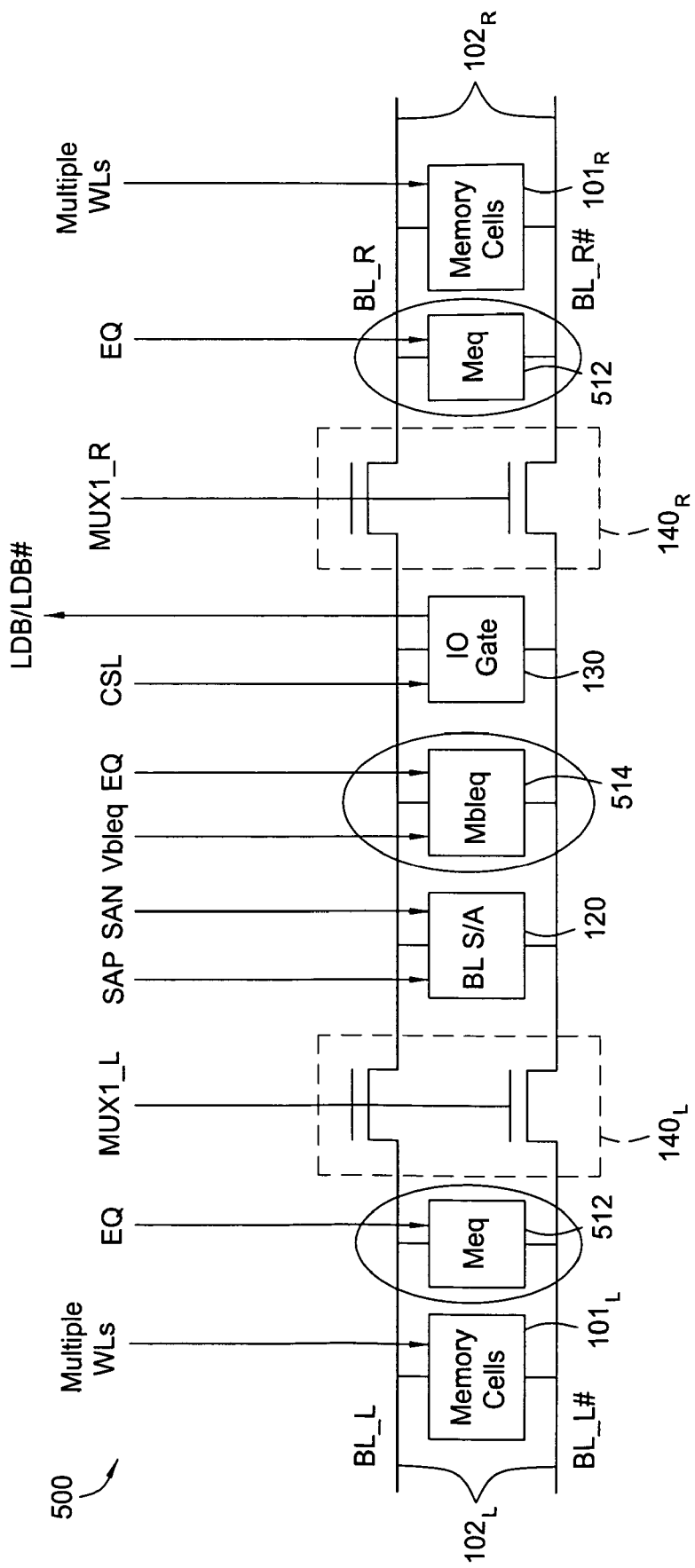
FIG. 5 illustrates an exemplary bitline structure in accordance with one embodiment of the present invention.

FIG. 5 illustrates an exemplary DRAM bitline structure 500 that may help avoid the previously described increased in standby current caused by bitline shorts. As illustrated, the structure 500 includes separate circuit elements 512 and 514 for equalizing and precharging, respectively, complementary bitline pairs 102 that share a common bit line sense amplifier (BLSA) 120. In other words, the equalizing circuit 512 may be controlled to selectively couple complementary bitlines to bring them to a common voltage level, while the precharge circuit 514 may be controlled to selectively couple a precharge voltage source to the complementary bitlines 102 to bring them to a precharge voltage level ($V_{BLEQ}$).

By providing a separate equalize circuit 512 outside of muxes/switches $140_L$ and $140_R$ used to select left or right side complementary bitline pairs ($102_L$ and $102_R$), a common equalization signal (EQ) may be used to control both the equalize and precharge circuits 512, 514. In this arrangement, the switches 140 may be maintained in an off position during standby or idle states. As a result, in the event a short is formed between a bitline and a wordline, the switched off switches would prevent the formation of a current path from the precharge circuit 514 and the defective wordline. For some embodiments, the equalize circuit 512 may include an NMOS transistor controlled by the EQ signal to selectively couple complementary bit lines together, while the precharge circuit 514 may include one or more NMOS transistors controlled by the EQ signal to selectively apply precharge voltage ($V_{BLEQ}$) to the complementary bit lines.

Figure 6A:
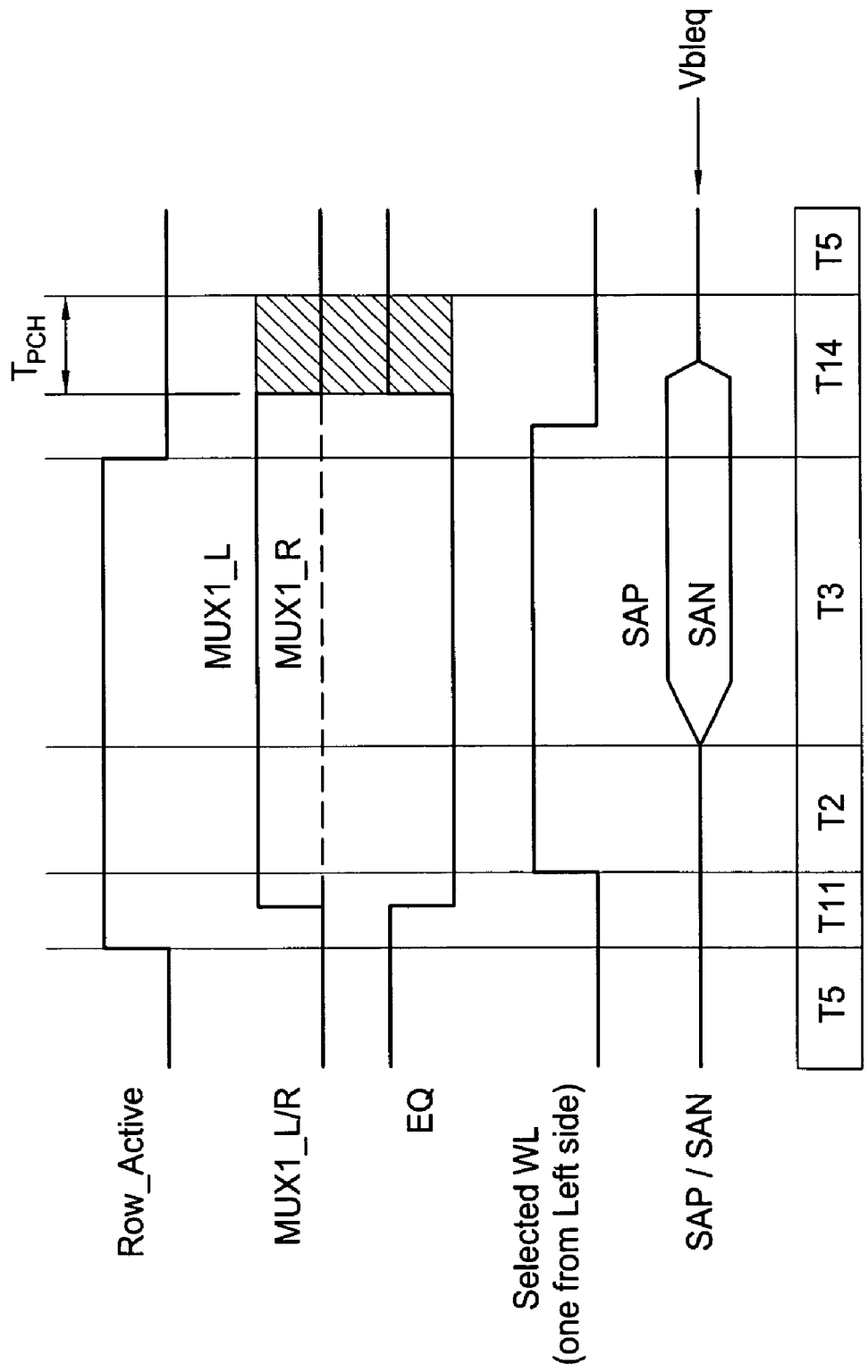
FIGS. 6A-6B are exemplary timing diagrams for memory cell access corresponding to the bitline structure of FIG. 5.
Figure 6B:
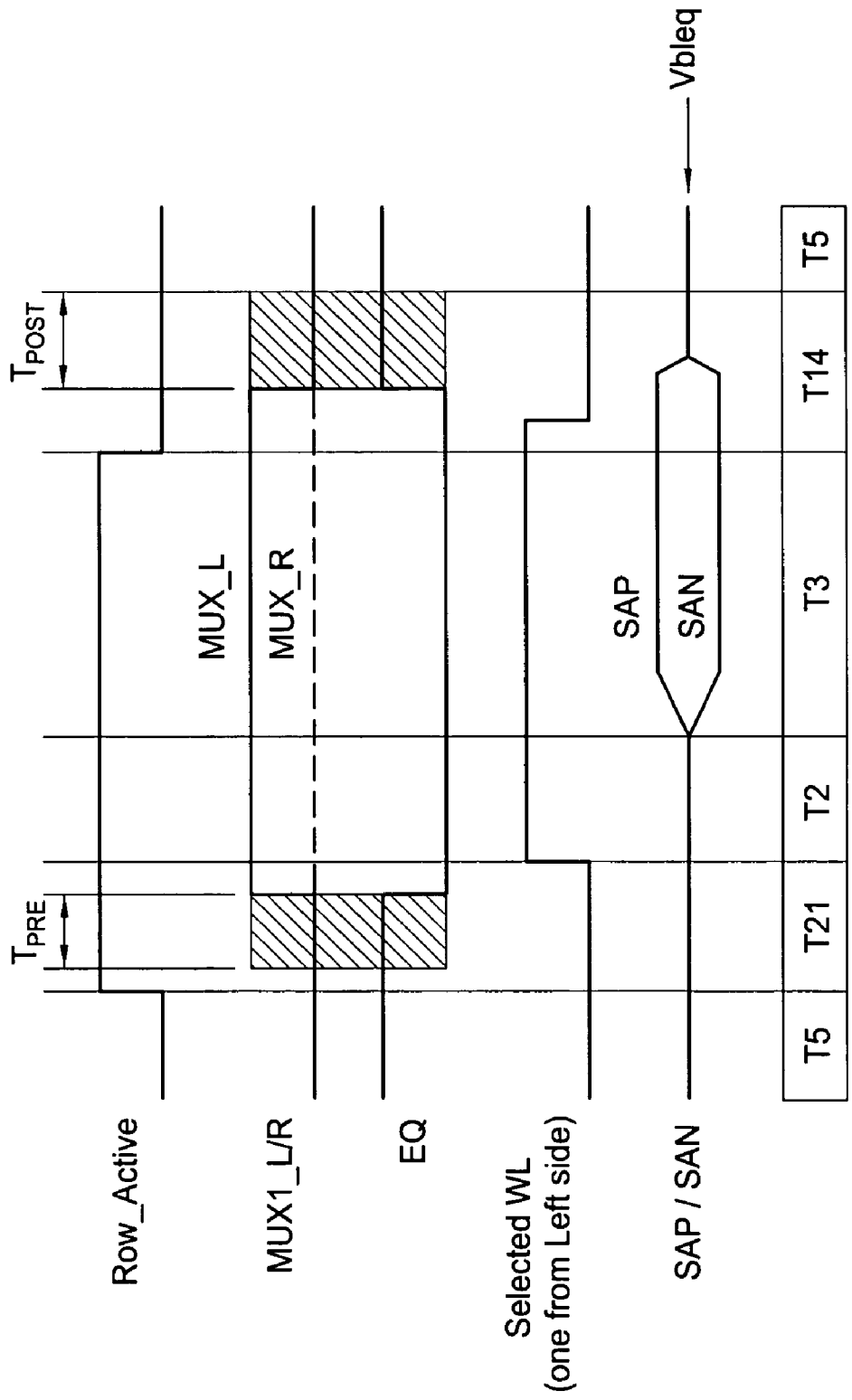

The timing diagrams shown in FIG. 6A and FIG. 6B illustrate how components of the bitline structure 500 may be operated to equalize and precharge complementary bit line pairs before and after a row access. The timing diagrams of FIGS. 6A-6B may be described with reference to FIGS. 7A-7C which illustrate the bitline structure 500 at various states before, during, and after a row access.

Referring first to FIG. 6A, prior to the row access (time T5), both switches are turned off (MUX_L and MUX_R=LO) and EQ is asserted, thereby allowing bit line pairs on both sides to be equalized. As illustrated in FIG. 7A, keeping the switches 140 turned off decouples the bitline pairs 102 from precharge circuit 514, preventing a current path to a wordline in the event of a short. As will be described in greater detail below, however, because the bitline pairs are decoupled from the precharge circuit 514, there is no guarantee that precharge voltage level ($V_{BLEQ}$) will be maintained between accesses.

Figure 7B:
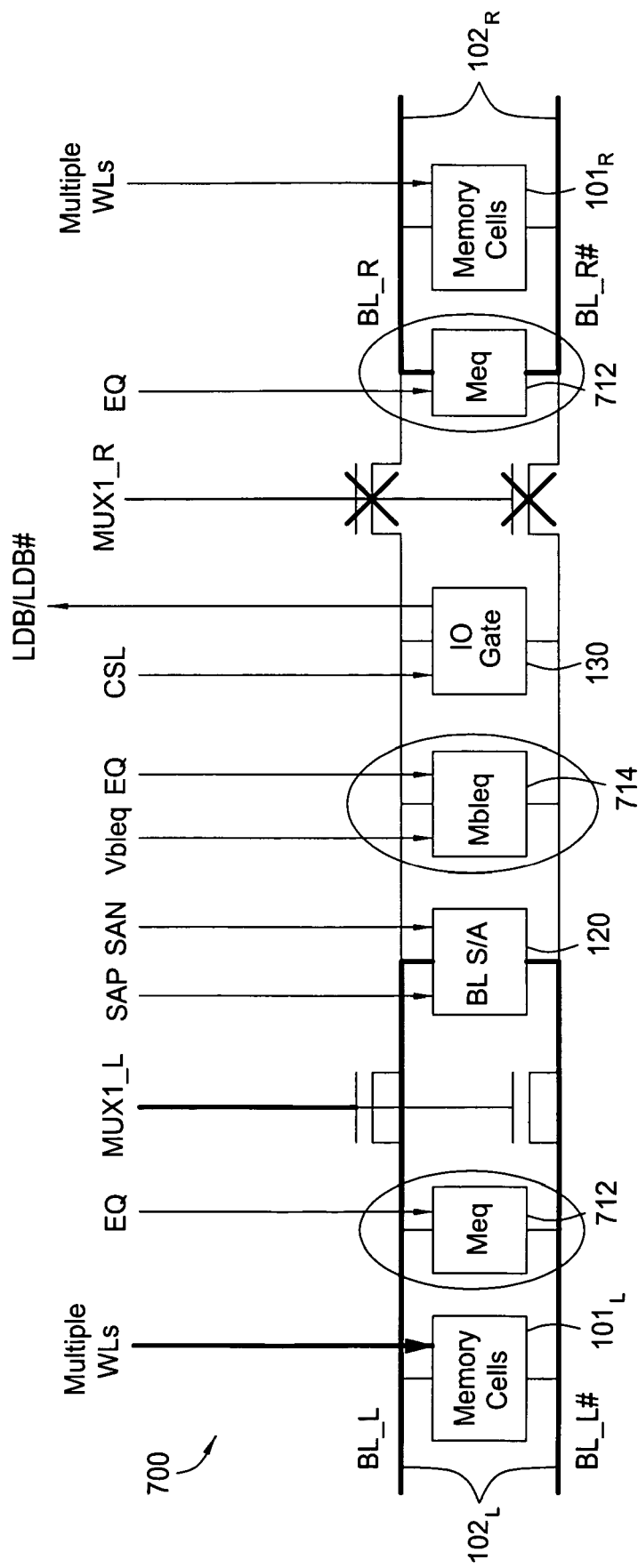

The access begins at T1, for example, with a Row_Active signal being asserted, which causes the switch 140 for the side being accessed to be turned on (illustratively, a left side access is performed) and the EQ signal to be de-asserted, thereby decoupling the bit lines from each other. At time T2, the selected word line (e.g., one the left side) is activated and sensing of corresponding memory cells occurs in period T3. As illustrated in FIG. 7B, turning on switch 140$_L$ couples the left side bit line pair 102$_L$ to the shared BLSA 120 for sensing data stored in the memory cells selected by the activated wordline.

Figure 7C:
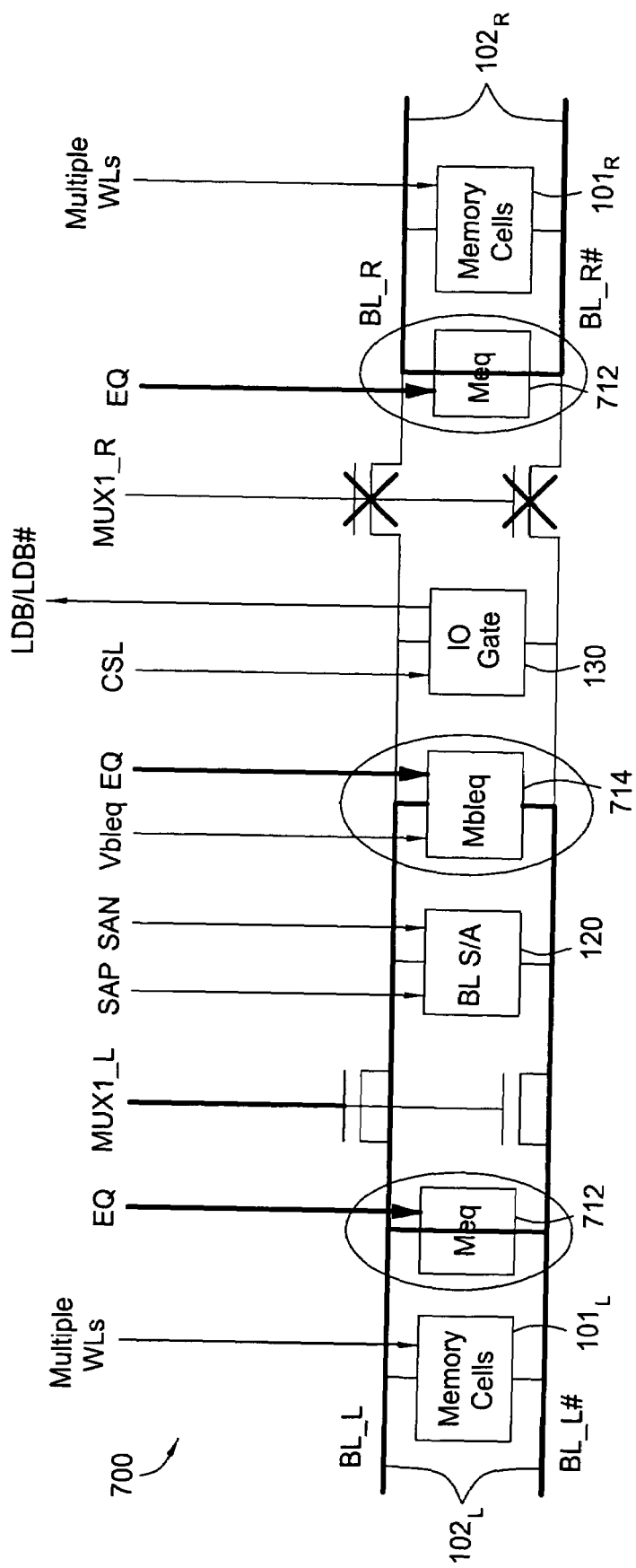

In period T4, the selected wordline is de-activated and the EQ signal is asserted, thereby bringing the bitlines 102 to a common voltage level via the equalize circuit 512. As illustrated in FIG. 7C, by keeping the switch 140$_L$ turned on (for a period labeled TPCH) while the EQ signal is asserted, the precharge circuit 514 brings the bitlines 102$_L$ to precharge voltage level ($V_{BLEQ}$). After this precharge time, the switch 140$_L$, thereby decoupling the left side bitline pair 102 from the precharge circuit 514, while maintaining equalization via the equalize circuit 512, as illustrated in FIG. 7A.

The timing arrangement shown in FIG. 6A may allow decreased standby current without increasing conventional access latencies, such as RAS to CAS delay (tRCD) and row precharge time (tRP). While the bitlines are decoupled from the precharge circuit 514, bitline precharge may be maintained for a finite period of time due to capacitance in the bitlines 102 (e.g., just as charge is maintained in a capacitor of a DRAM memory cell). However, to ensure sufficient precharge level is maintained between accesses, a new timing parameter may be introduced. This new timing parameter, which may be referred to as maximum auto refresh time (tARI$_{MAX}$), may be presented as a specification to customers, as a maximum interval between row accesses (e.g., during auto-refresh operations).

FIG. 6B shows an alternative timing arrangement, however, which may eliminate the need for customers to satisfy tARI$_{MAX}$. As illustrated, by extending the on-time of the EQ signal (TPRE) at the beginning of an access, "recovery" of sufficient precharge voltage may be assured, albeit at the potential cost of an addition of time to tRCD (e.g., tRCD may increase by a few ns). A post-access precharge time (TPOST) may still be performed. For some embodiments, the timing shown in FIG. 6C may be used when a device is in self-refresh mode and/or may be used for PSRAM devices which have a hidden self-refresh mode, where an increase to tRCD may be effectively hidden. For some embodiments, during other (non self-refresh) modes of operation, the timing of FIG. 6A may be used.

FIG. 8 illustrates another exemplary DRAM bitline structure 800 that may help avoid an increase in standby current caused by bitline shorts. Like the exemplary structure 500 described above, the exemplary structure 800 also includes separate circuit elements 812 and 814 for equalizing and precharging, respectively, complementary bitline pairs 102 that share a common bit line sense amplifier (BLSA) 120.

However, by utilizing an additional control signal (EQ_C) for controlling the precharge circuit 814, the switches may be maintained in an on state during standby, which may allow a single equalization circuit 812 to be shared between the complementary bitline pairs 102. In other words, as illustrated in FIG. 9, the precharge circuit 814 may be controlled to selectively apply the precharge voltage ($V_{BLEQ}$) to the complementary bitlines 102 only when both EQ and EQ_C are asserted. Thus, by de-asserting EQ_C, bitline pairs 102 may be maintained in equalization, without supplying precharge voltage, thus preventing the formation of a current path from the precharge voltage supply (e.g., a charge pump) and the defective wordline in the event of a short.

Figure 10:
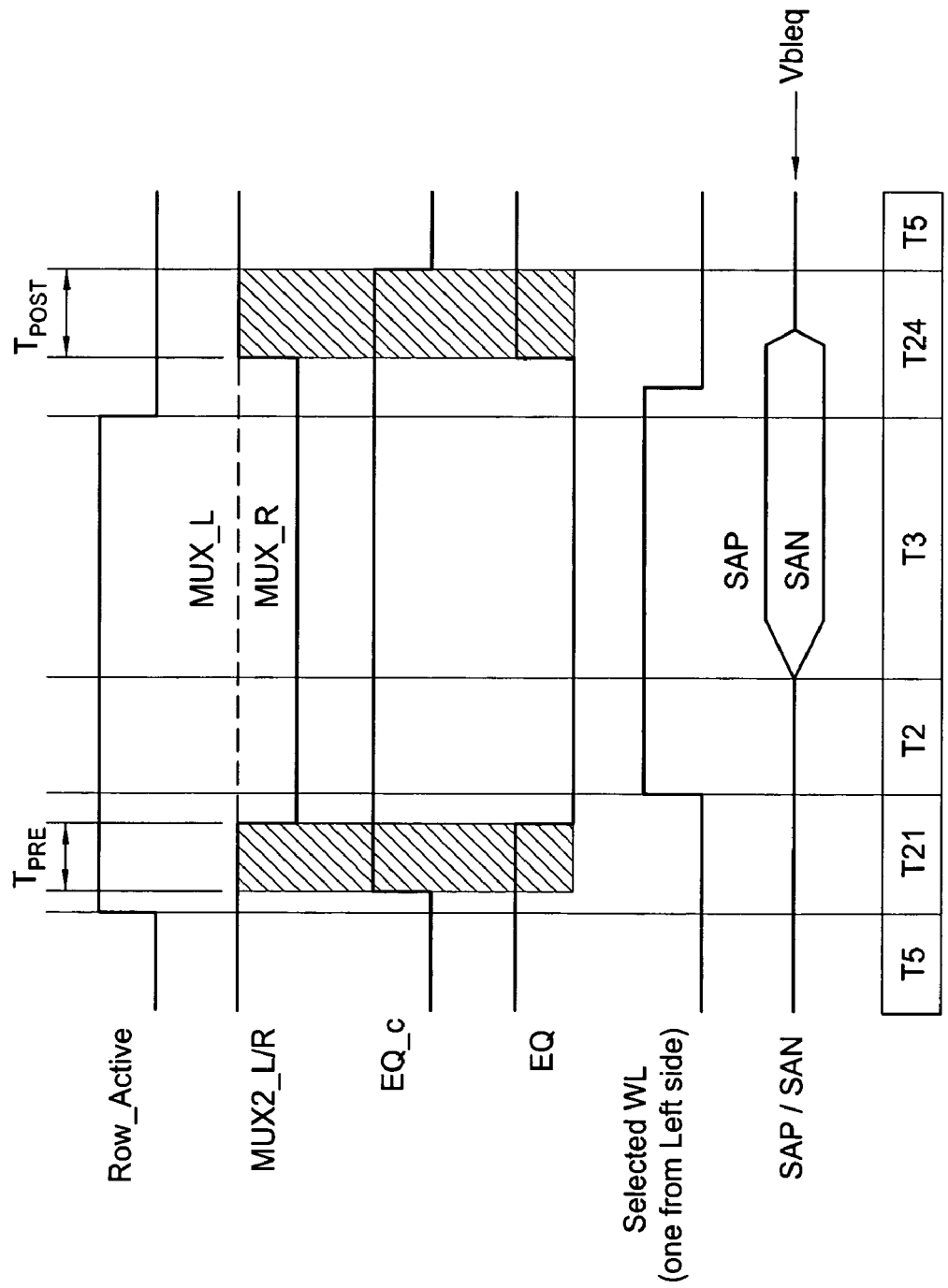
FIG. 10 is a timing diagram for memory cell access corresponding to the bitline structure of FIG. 8.

The timing diagram shown in FIG. 10 illustrates how components of the bitline structure 800 may be operated to equalize and precharge complementary bit line pairs before and after a row access. The timing diagram of FIG. 10 may be described with reference to FIGS. 11A-11D which illustrate the bitline structure 800 at various states before, during, and after a row access.

Figure 11A:
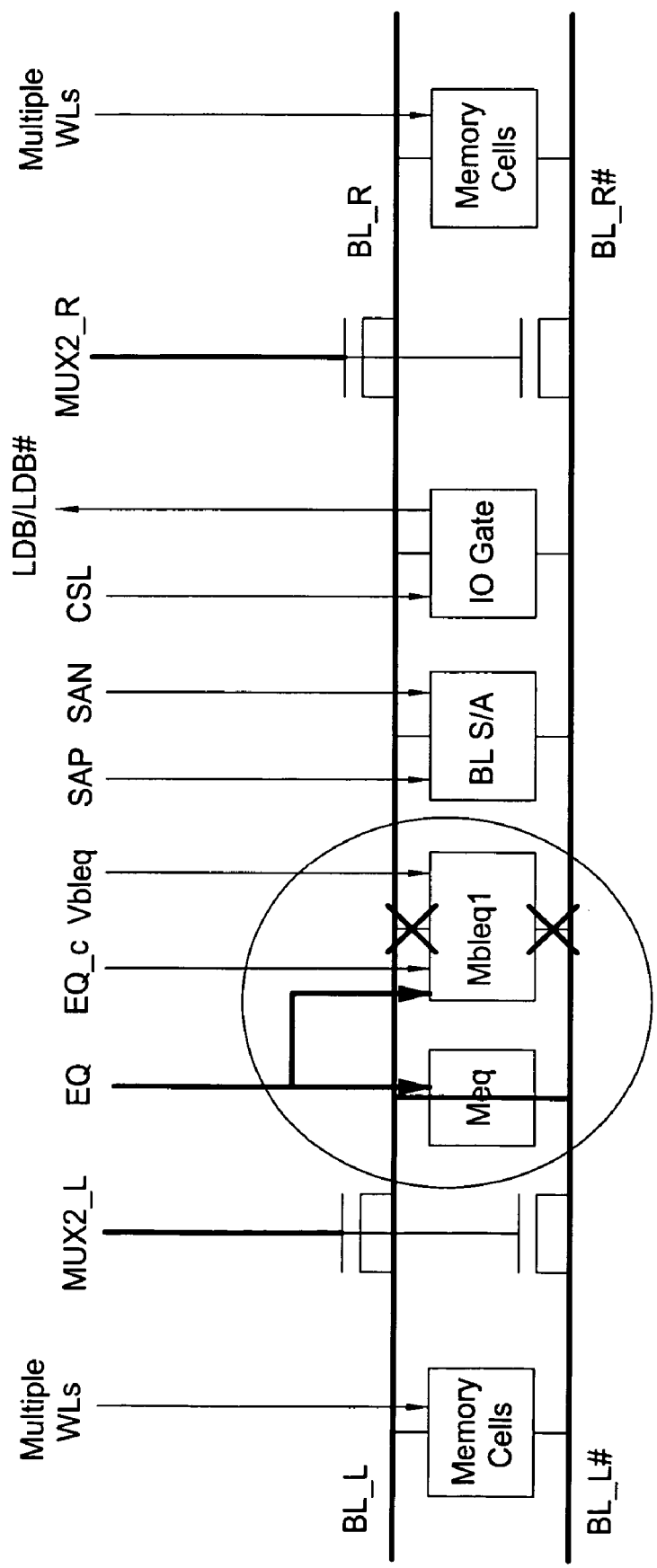
FIG. 11 illustrates the exemplary bitline structure of FIG. 8 at various stages of a memory cell access.

Prior to the row access (time T5), both switches are turned on (MUX_L and MUX_R=LO) and EQ is asserted, thereby allowing bit line pairs on both sides to be equalized via the single equalize circuit 812, while de-asserting EQ_C. As illustrated in FIG. 11A, keeping EQ_C de-asserted switches of precharge circuit 514, decoupling the bitline pairs 102 from precharge voltage source ($V_{BLEQ}$).

Figure 11B:
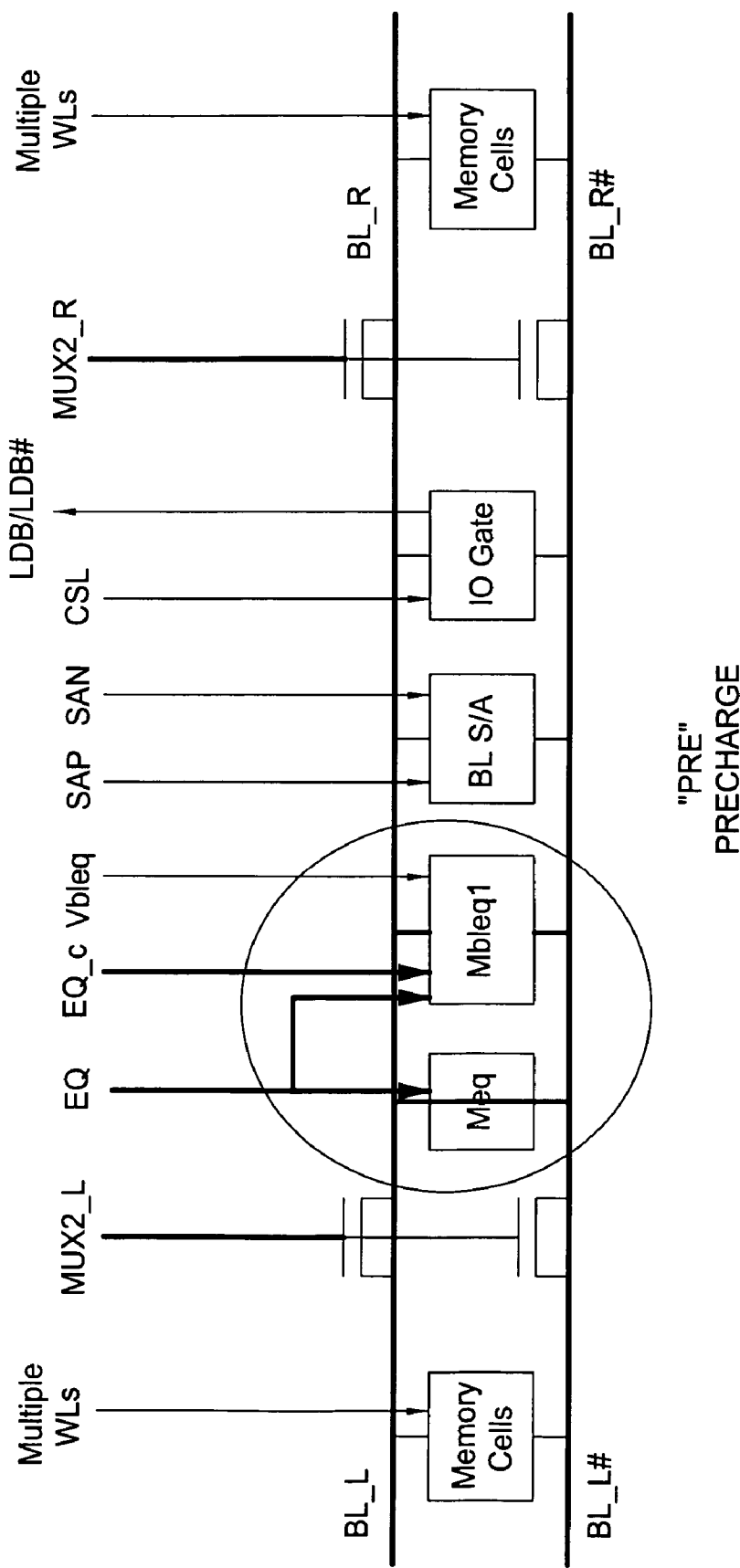
Figure 11D:
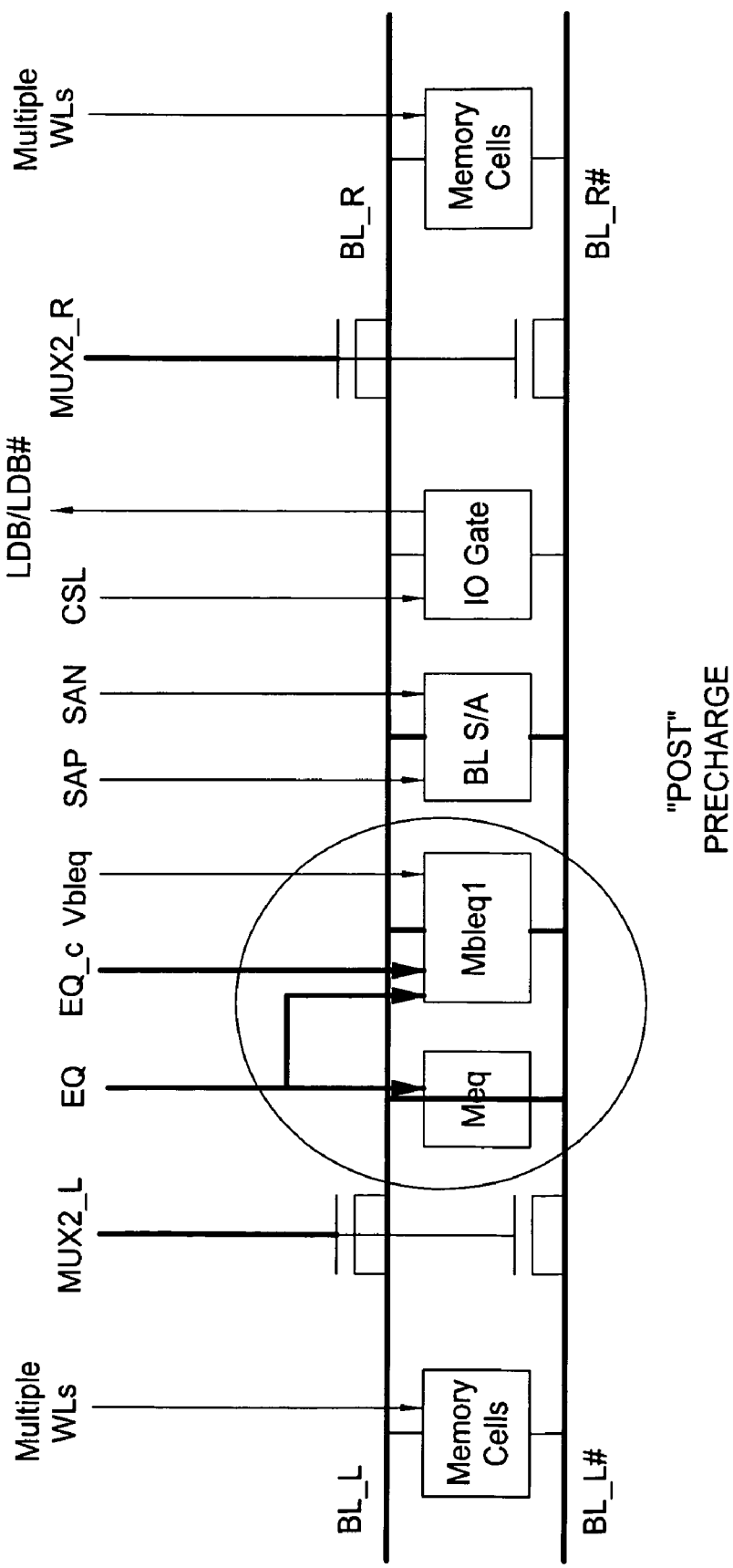

The access begins at T1, for example, with a Row_Active signal being asserted, which causes the switch 140 for the side not being accessed to be turned off (illustratively, a left side access is performed), the EQ signal to be de-asserted, thereby decoupling the bit lines from each other. For some embodiments, because the bitline pairs are decoupled from the precharge voltage source ($V_{BLEQ}$) during standby and there is no guarantee that precharge voltage level ($V_{BLEQ}$) will be maintained between accesses, the EQ_C signal may be asserted for some precharge time (TPRE) prior to de-asserting the EQ signal. As illustrated in FIG. 11B, asserting EQ_C during this precharge time may switch on precharge circuit 814 and allow recovery of sufficient precharge voltage via circuit 814 prior to the row access.

At time T2, the selected word line (e.g., one the left side) is activated and sensing of corresponding memory cells occurs in period T3. As illustrated in FIG. 11C, turning off switch 140$_R$ prior to T2 decouples the right side bit line pair 102$_R$ from the shared BLSA 120, allowing data stored in the memory cells selected by the activated wordline on the left side to be sensed via left side bit line pair 102$_L$.

In period T4, the selected wordline is de-activated, the right side switch 140$_R$ is again turned on, and the EQ signal is asserted, thereby equalizing bitlines 102 on both sides via the equalize circuit 812. As illustrated in FIG. 11D, by again asserting EQ_C to activate precharge circuit 814 (for a period TPST), bitlines 102 on both sides may also be brought to the precharge voltage level. After this (post) precharge time, EQ_C is again de-asserted, until the next row access.

As described above, the timing arrangement illustrated in FIG. 10 involves a precharge cycle before the actual row access to assure sufficient "recovery" of precharge time. As a result, the need for an additional timing parameter to ensure sufficient precharge voltage is maintained between accesses ($tARI_{MAX}$) may be avoided. For some embodiments, however, the precharge cycle before row access may be removed and the $tARI_{MAX}$ may be required. As previously described, for some embodiments, within a single device, precharge operations may be performed before accesses during a self-refresh mode, while $tARI_{MAX}$ should be satisfied during other modes to ensure sufficient precharge voltage is maintained on the bitlines.

Figure 1:
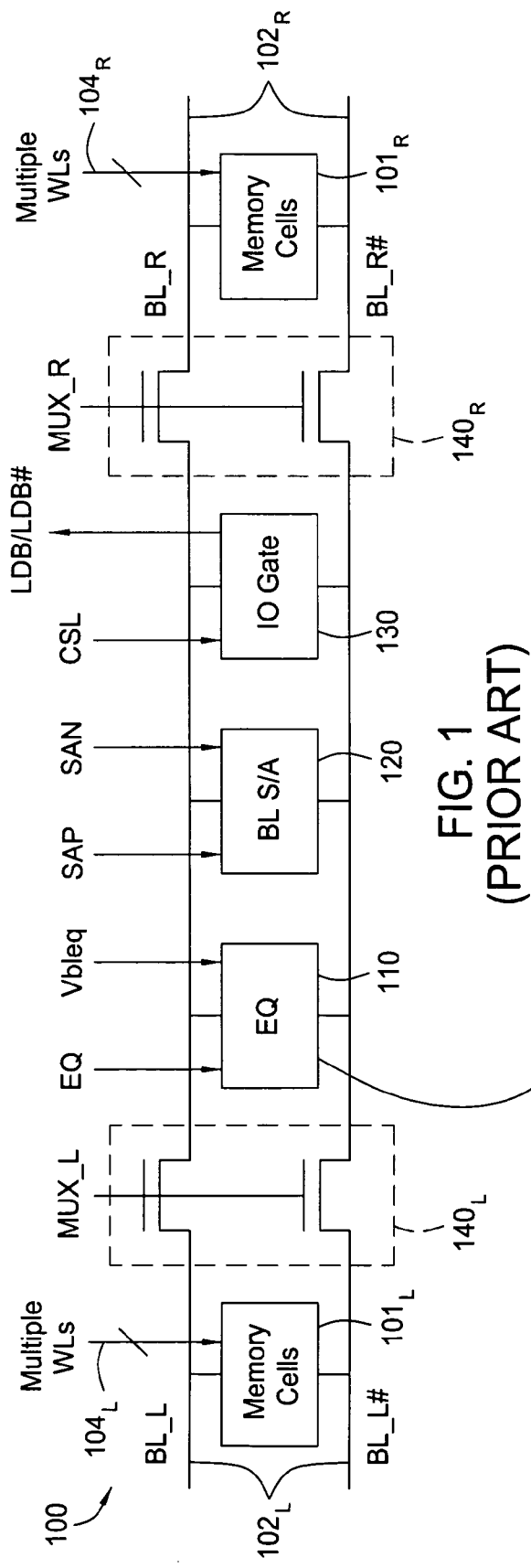
FIG. 1 illustrates a conventional bitline structure.
Figure 2:
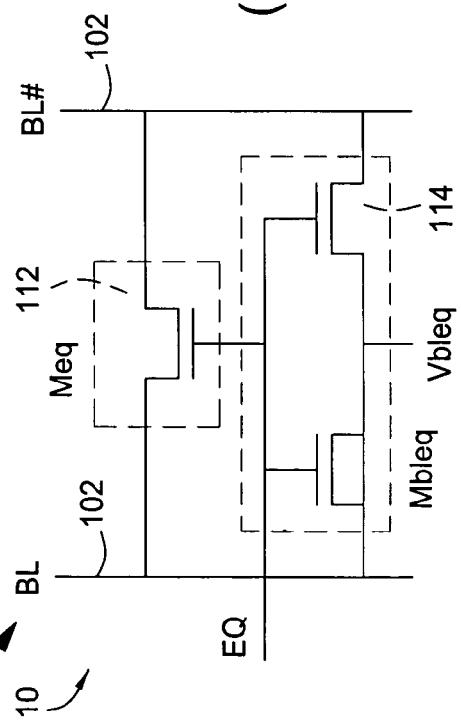
FIG. 2 illustrates conventional equalize and precharge circuitry.
Figure 3:
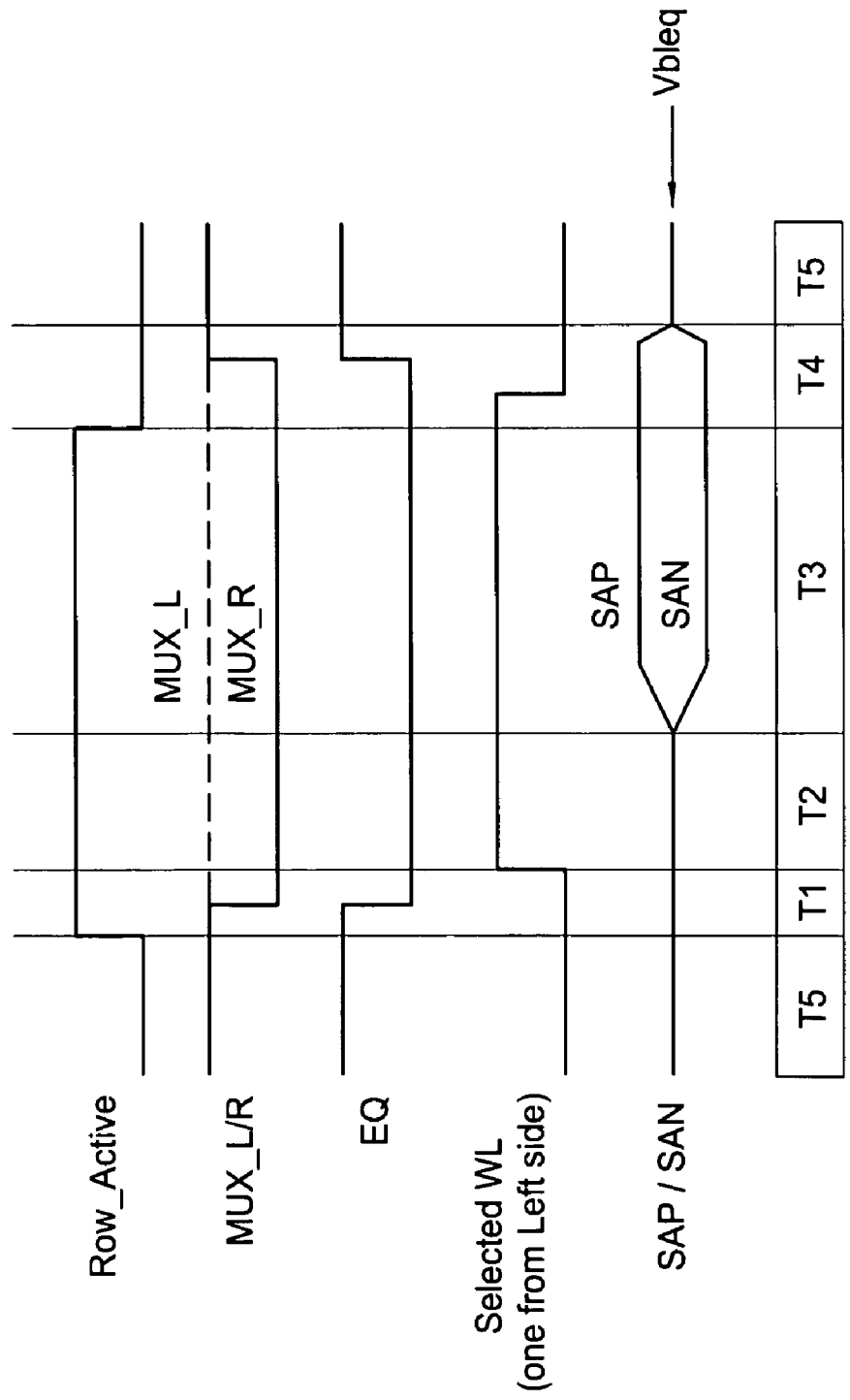
FIG. 3 is a timing diagram for conventional memory cell access corresponding to the bitline structure of FIG. 1.
Figure 4:
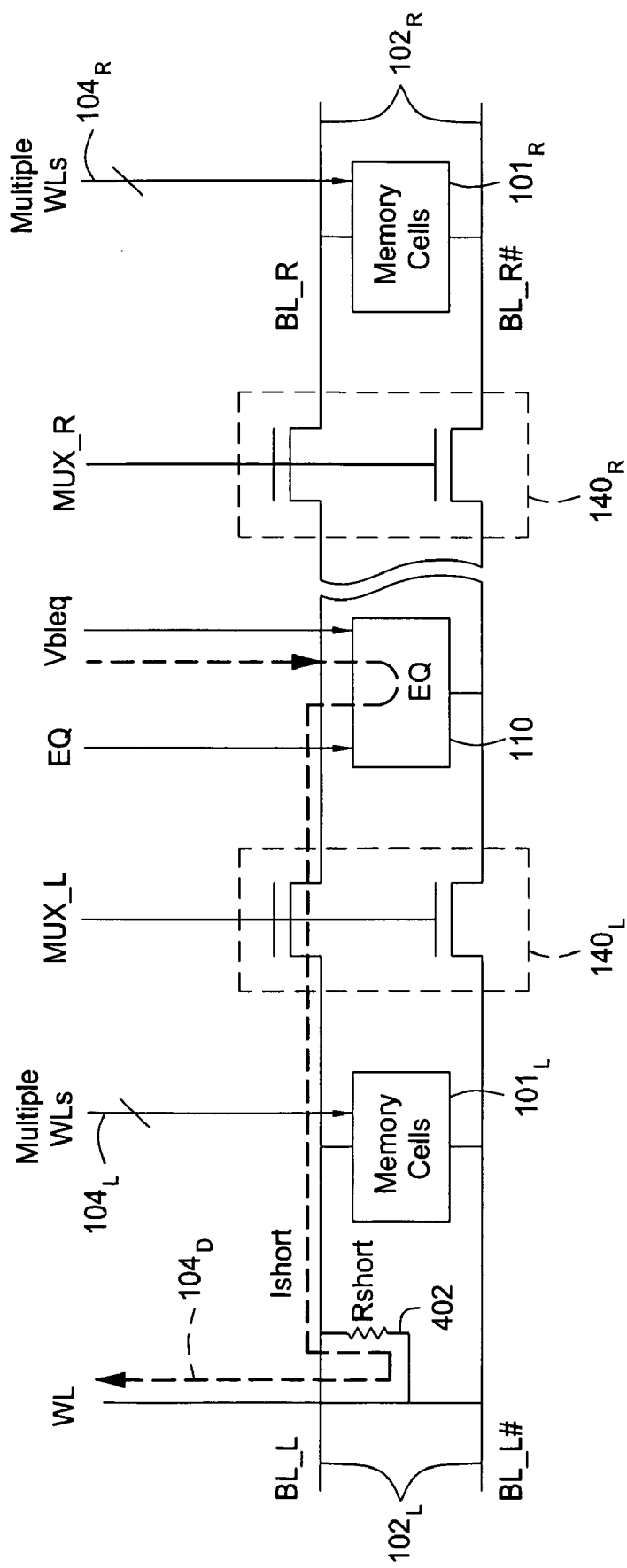
FIG. 4 illustrates increased current draw due to a short between a wordline and bitline in accordance with the bitline structure of FIG. 1.

For some embodiments, one or more of the various timing arrangements described above may be selectively enabled. For example, for some embodiments, a mechanism may be provided to select between conventional timing (such as that shown in FIG. 3) and the timing described herein. As an example, a set of one or more programmable fuses may be provided to select between conventional timing and the timing described herein. In a similar manner, a set of one or more programmable fuses may be provided to select between a timing arrangement that impacts tRCD and a timing arrangement that does not impact tRCD, but might necessitate an additional timing parameter ($tARI_{MAX}$).

Figure 12:
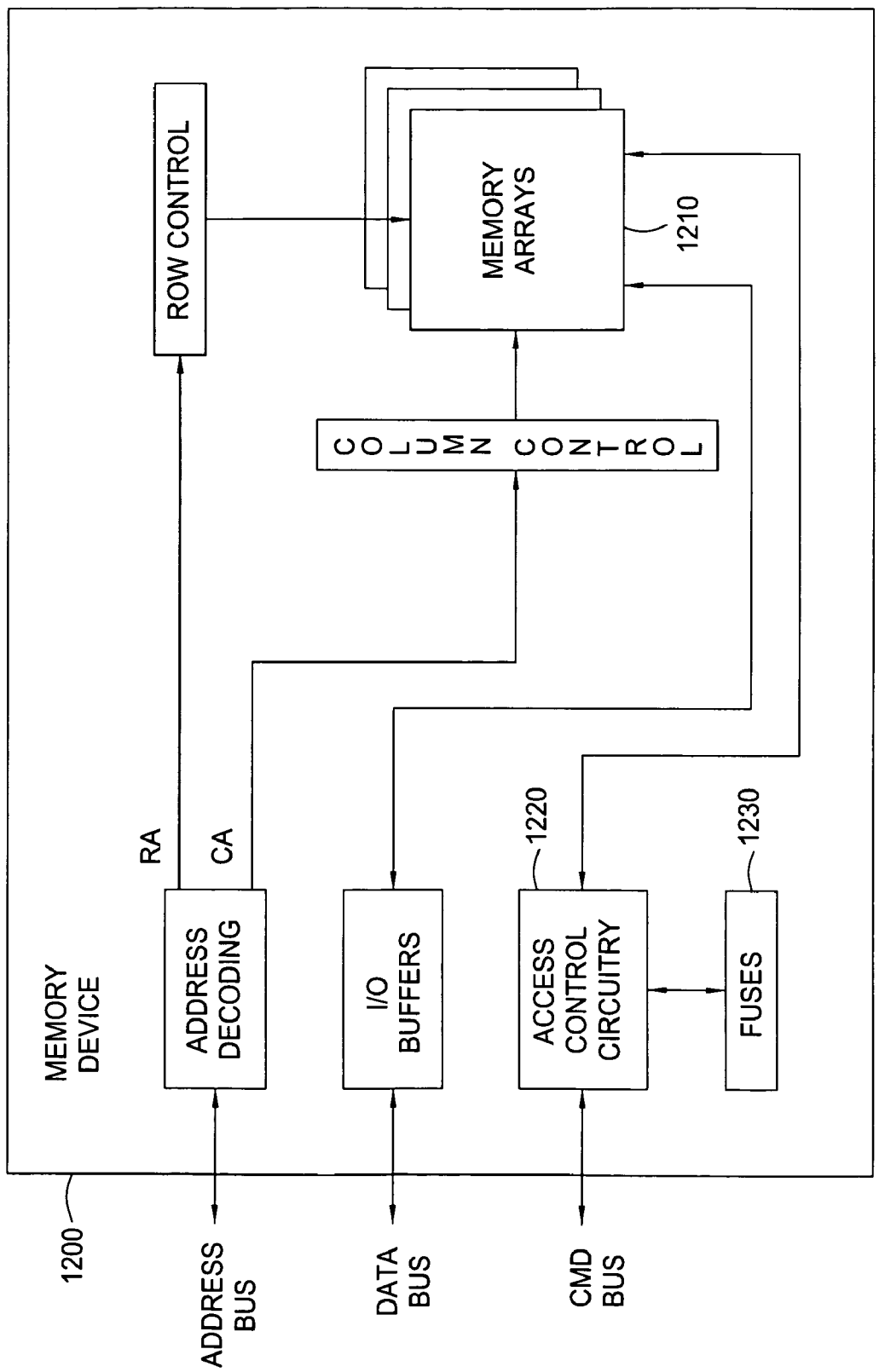
FIG. 12 illustrates an exemplary memory device in accordance with one embodiment of the present invention.

Accordingly, as illustrated in FIG. 12, a memory device 1200 having the bitline structures described herein within a set of memory arrays 1210, may include control circuitry 1220 configured to access memory cells according to the one or more of the techniques described above (e.g., generating mux select, precharge and equalize signals according to one or more of the timing diagrams described above), based on the states of a set of fuses 1230.

As a result, the same product design may be rated to have different operating specifications, depending on the particular timing arrangement selected. The potential increase in production yield may more than offset the potential reduction in operating frequencies for some parts (due to the potential increase in tRCD). In other words, timing arrangements and mechanisms described herein may allow the sale and use of parts that might otherwise have failed standby current consumption requirements.

While the foregoing is directed to embodiments of the present invention, other and further embodiments of the invention may be devised without departing from the basic scope thereof, and the scope thereof is determined by the claims that follow.

What is claimed is:

1. A method for accessing memory cells of a memory device, comprising:
   equalizing bitlines of a complementary bitline pair between accesses of memory cells involving the complementary bitline pair to bring the bitlines of the complementary bitline pair to a common voltage level; and
   decoupling the bitlines of the complementary bitline pair from a precharge voltage source during the equalizing.

2. The method of claim 1, further comprising:
   coupling the bitlines of the first complementary bitline pair to the precharge voltage source prior to accessing memory cells involving the first complementary bitline pair.

3. The method of claim 2, further comprising:
   again decoupling the bitlines of the first complementary bitline pair from the precharge source prior to accessing the memory cells involving the first complementary bitline pair; and
   coupling the bitlines of the first complementary bitline pair to the precharge voltage source subsequent to accessing memory cells involving the first complementary bitline pair.

4. The method of claim 1, wherein equalizing the bitlines of the first complementary bitline pair comprises changing the state of a first switch controlled by an equalization signal.

5. The method of claim 4, wherein decoupling the bitlines of the first complementary bitline pair from the precharge voltage source comprises changing the state of a second switch controlled, at least in part, by the equalization signal.

6. A method for accessing memory cells of a memory device, comprising:
   accessing a set of memory cells with a first pair of complementary bitlines that share a common sense amplifier with a second pair of complementary bitlines;
   equalizing a first pair of complementary bitlines;
   precharging the first pair of complementary bitlines by coupling the first pair of complementary bitlines to a precharge voltage source; and
   decoupling the first pair of complementary bitlines from the precharge voltage source during the equalizing of the first pair of complementary bitlines and prior to accessing the memory cells again with the first pair of complementary bitlines.

7. The method of claim 6, further comprising:
   coupling the first and second pair of complementary bitlines together during the equalizing.

8. The method of claim 6, further comprising:
   again precharging the first pair of complementary bitlines by coupling the first pair of complementary bitlines to a precharge voltage source prior to accessing the memory cells again with the first pair of complementary bitlines.

9. A method for accessing memory cells of a memory device, comprising:
   equalizing bitlines of first and second complementary bitline pairs between accesses of memory cells, wherein each access involves one of the first and second complementary bitline pairs and a bit line sense amplifier shared between the first and second complementary bitline pairs; and
   decoupling the bitlines of the first and second complementary bitline pairs from a precharge voltage source during the equalizing.

10. The method of claim 9, wherein the first and second complementary bitline pairs are selectively coupled to the shared bit line sense amplifier via independently controlled first and second switches.

11. The method of claim 10, wherein the first and second switches are controlled to couple the first and second complementary bitline pairs together during the equalizing.

12. The method of claim 10, wherein the first and second switches are controlled to decouple the first and second complementary bitline pairs from each other during the equalizing.

13. The method of claim 9, wherein decoupling the bitlines of the first and second complementary bitline pair from the precharge voltage source comprises changing the state of a second switch controlled, at least in part, by the equalization signal.

14. A memory device, comprising:
   at least one pair of complementary bitlines;
   a plurality of wordlines to selectively couple memory cells to the complementary bitline pair;
   equalize circuitry configured to equalize the pair of complementary bitlines between accesses of the memory cells; and
   precharge circuitry configured to decouple the pair of complementary bitlines from a precharge voltage source while the pair of complementary bitlines is being equalized between accesses of the memory cells.

15. The memory device of claim 14, wherein the precharge circuitry is further configured to:
   couple the pair of complementary bitlines to the precharge voltage source after an access of the memory cells and while the pair of complimentary bitlines is being equalized and prior to decoupling the pair of complementary bitlines from the precharge voltage source.

16. The memory device of claim 15, wherein the precharge circuitry is further configured to:
   couple the pair of complementary bitlines to the precharge voltage source prior to an access of the memory cells.

17. The memory device of claim 15, wherein:
   the memory device further comprises one or more fuses; and
   operation of the at least one of the equalize circuitry and the precharge circuitry is dependent on the state of one or more of the fuses.

18. A bitline structure, comprising:
   a bitline sense amplifier;
   first and second pairs of complementary bitlines that share the bitline sense amplifier; and
   control circuitry configured to access a set of memory cells with the first pair of complementary bitlines, equalize the first pair of complementary bitlines after the access, precharge the first pair of complementary bitlines by coupling the first pair of complementary bitlines to a precharge voltage source, and decouple the first pair of complementary bitlines from the precharge voltage source while the pair of complementary bitlines is being equalized and prior to a subsequent access of the memory cells.

19. The bitline structure of claim 18, wherein the control circuitry comprises:
   a precharge circuit for selectively coupling the first and second pairs of complementary bitlines to the precharge voltage source and at least one equalize circuit.

20. The bitline structure of claim 19, wherein the at least one equalize circuit comprises first and second equalize circuits to couple together bitlines of the first and second pair of complementary bitlines, respectively.

21. The bitline structure of claim 19, wherein:
   the equalize circuit is controlled by a first control signal; and
   the precharge circuit is controlled, at least in part, by the first control signal.

22. The bitline structure of claim 21, wherein the precharge circuit is controlled, at least in part, by a second control signal.

23. A memory device, comprising:
   first and second pairs of complementary bitlines that share a common bitline sense amplifier;
   a plurality of wordlines to selectively couple memory cells to the first and second pairs of complementary bitlines;
   equalize means for equalizing the first and second pairs of complementary bitlines between accesses of the memory cells; and
   precharge means for decoupling the pair of complementary bitlines from a precharge voltage source while the pair of complementary bitlines is being equalized between accesses of the memory cells.

24. The memory device of claim 23, wherein the equalize means comprises separate equalize means for each the first and second pairs of complementary bitlines.

25. Memory device of claim 23, wherein the equalize and precharge means are both controlled, at least in part, by a first control signal.

26. The memory device of claim 25, wherein the precharge means is also controlled, at least in part, by a second control signal.

* * * * *